(12) United States Patent
Lee et al.

(10) Patent No.: US 7,482,222 B2
(45) Date of Patent: Jan. 27, 2009

(54) SEMICONDUCTOR DEVICE AND METHOD OF MANUFACTURING THE SAME

(75) Inventors: Jin-Woo Lee, Suwon-si (KR); Cheol-Ju Yun, Seongnam-si (KR); Hyeoung-Won Seo, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 26 days.

(21) Appl. No.: 11/769,276

(22) Filed: Jun. 27, 2007

(65) Prior Publication Data

US 2008/0014695 A1    Jan. 17, 2008

Related U.S. Application Data

(62) Division of application No. 11/171,710, filed on Jun. 30, 2005, now Pat. No. 7,247,541.

(30) Foreign Application Priority Data

Jul. 7, 2004    (KR) .............................. 2004-52685

(51) Int. Cl.
*H01L 21/8242*    (2006.01)
(52) U.S. Cl. .................. 438/253; 438/270; 438/396
(58) Field of Classification Search ................ 438/238, 438/242, 253, 255, 256, 270–273, 396–399
See application file for complete search history.

(56) References Cited

U.S. PATENT DOCUMENTS 5,945,707 A * 8/1999 Bronner et al. ............. 257/330
7,384,849 B2 * 6/2008 Parekh et al. ............... 438/270

* cited by examiner

*Primary Examiner*—Tuan H Nguyen
(74) *Attorney, Agent, or Firm*—F. Chau & Associates, LLC

(57) ABSTRACT

A semiconductor device comprises a plurality of gate structures formed on a substrate, a gate spacer formed on a sidewall of the gate structures, a semiconductor pattern formed on the substrate between the gate structures, a first impurity region and a second impurity region formed in the semiconductor pattern and at surface portions of the substrate, respectively, wherein the first and second impurity regions include a first conductive type impurity, and a channel doping region surrounding the first impurity region, wherein the channel doping region includes a second conductive type impurity.

4 Claims, 14 Drawing Sheets

SEMICONDUCTOR DEVICE AND METHOD OF MANUFACTURING THE SAME

CROSS-REFERENCE TO RELATED APPLICATIONS

This application is a divisional of U.S. application Ser. No. 11/171,710 filed on Jun. 30, 2005, now U.S. Pat. No. 7,247,541, which claims priority under 35 U.S.C. § 119 to Korean Patent Application No. 2004-52685 filed on Jul. 7, 2004, the disclosures of which are herein incorporated by reference in their entirety.

TECHNICAL FIELD

The present disclosure relates to a semiconductor device and a method of manufacturing the same, and more particularly to a semiconductor memory device including a transistor and a method of manufacturing the same.

DISCUSSION OF RELATED ART

Integration degree, reliability and the response speed of semiconductor devices need to be improved to operate the semiconductor devices at a high speed and to have a large storing capacitance.

A dynamic random access memory (DRAM) device is an example of the semiconductor device having characteristics of a large storing capacitance and a high facility of storing and erasing data. The DRAM device includes a memory cell for storing data using electric charges and peripheral circuits for transferring the electric charges as an input/output of the data. The memory cell includes an access transistor and a capacitor.

A recent high integration trend of semiconductor devices requires the transistor and the capacitor of the memory device to occupy a smaller space. Thus, it is difficult to maintain a stable and steady operation in the memory device, which is important when a design rule of the memory device is smaller than about 0.1 µm.

For example, it becomes difficult to overcome a short channel effect as a gate length of a memory device is shortened. As a junction leakage current is increased, a data retention time is reduced and a refresh characteristic is deteriorated. A contact area of a contact plug that contacts with a source/drain is reduced. Thus, an electrical resistance of the contact plug is increased and becomes an obstacle to the stable and steady operation of the memory device.

Recently, a recessed transistor for overcoming the short channel effect has been studied. The recessed transistor is formed in a trench of a substrate known as a gate trench. However, the recessed transistor has a problem in that an operation characteristic of a left portion of the transistor is different from that of a right portion of the transistor when the gate trench on the substrate is not aligned to a gate electrode pattern. The recessed transistor also has a problem in that a parasite capacitance of a word line is increased in a memory device since a surface of a gate oxide layer is increased as compared with a conventional planar transistor. The increased parasite capacitance reduces an operation speed of the recessed transistor.

SUMMARY OF THE INVENTION

Exemplary embodiments of the present invention provides a semiconductor device including a transistor for reducing a junction leakage current and a electrical resistance of a contact at source/drain regions and a method of manufacturing same.

According to an embodiment of the present invention, a semiconductor device comprising a plurality of gate structures is formed on a substrate, and a gate spacer is formed on a sidewall of the gate structures. A semiconductor pattern is formed on the substrate between the gate structures. A first impurity region is formed in the semiconductor pattern and a second impurity region is formed at surface portions of the substrate. The first and second impurity regions includes a first conductive type impurity. A channel doping region is formed below the first impurity region to surround the first impurity region, and the channel doping region is doped with a second conductive type impurity.

According to another embodiment of the present invention, a semiconductor device comprises a substrate including a gate trench, a plurality of gate structures formed on the substrate, and a gate spacer formed on a sidewall of the gate structures. A lower portion of each gate structure is formed in the trench, and the gate spacer is formed on a portion of a sidewall of each of the gate structures protruded from the substrate. A semiconductor pattern on exposed portions of the substrate between the gate spacers is formed. A first impurity region is formed in the semiconductor pattern and a second impurity region is formed at surface portions of the substrate, and the first and second impurity regions include a first impurity. A channel doping region is formed under the first impurity region and includes a second impurity.

According to another embodiment of the present invention, a method of manufacturing a semiconductor device comprises forming a plurality of gate structures on a substrate, forming a gate spacer on a sidewall of each gate structure, forming a semiconductor pattern on exposed portions of the substrate between the gate spacers, forming a channel doping region in the substrate between predetermined adjacent gate spacers by implanting a second conductive type impurity onto the semiconductor pattern, and forming a first impurity region and a second impurity region in the semiconductor pattern and at surface portions of the substrate by implanting a first conductive type impurity onto the semiconductor pattern, wherein the first impurity region is surrounded by the channel doping region.

According to another embodiment of the present invention, a method of manufacturing a semiconductor device comprises forming a plurality of gate structures on a substrate, forming a gate spacer on a sidewall of each of the plurality of gate structures, forming a semiconductor pattern on exposed portions of the substrate between the gate spacers, implanting first dopants onto the substrate including the semiconductor pattern for forming a first impurity region and a second impurity region in the semiconductor pattern at surface portions of the substrate, forming a first insulation interlayer on the substrate including the plurality of gate structures for covering the plurality of gate structures with the first insulation interlayer, forming first and second contact pads through the first insulation interlayer, wherein the first contact pad contacts the first impurity region and the second contact pad contacts the second impurity region, forming a second insulation interlayer on the first insulation interlayer and the first and second contact pads, forming a contact hole in the second insulation interlayer for exposing the first contact pad through the contact hole, and implanting second dopants onto a bottom of the contact hole to form a channel doping region under the first impurity region, wherein the first impurity region is surrounded by the channel doping region.

According to another embodiment of the present invention, a method of manufacturing a semiconductor device comprises forming a plurality of gate trenches on a substrate by partially etching the substrate, forming a plurality of gate structures on the substrate, wherein a lower portion of at least some of the plurality of gate structures is formed in the plurality of gate trenches, forming a gate spacer on a portion of a sidewall of each gate structure protruded from the substrate, forming a semiconductor pattern on the substrate between the plurality of gate structures, forming a channel doping region in the substrate between predetermined adjacent gate spacers by implanting a second conductive type impurity onto the semiconductor pattern, and forming a first impurity region and a second impurity region in the semiconductor pattern and at surface portions of the substrate by implanting a first conductive type impurity onto the semiconductor pattern, wherein the first impurity region is surrounded by the channel doping region.

According to another exemplary embodiment of the present invention, a method of manufacturing a semiconductor device comprises forming a plurality of gate trenches on a substrate by partially etching the substrate, forming a plurality of gate structures on the substrate, wherein a lower portion of at least some of the plurality of gate structures is formed in the plurality of gate trenches, forming a gate spacer on a portion of a sidewall of each gate structure protruded from the substrate, forming a semiconductor pattern on the substrate between the plurality of gate structures, implanting a first impurity onto the substrate including the semiconductor pattern for forming a first impurity region and a second impurity region in the semiconductor pattern and at surface portions of the substrate, forming a first insulation interlayer on the substrate including the plurality of gate structures for covering the plurality of gate structures with the first insulation interlayer, forming first and second contact pads through the first insulation interlayer, wherein the first contact pad contacts the first impurity region and the second contact pad contacts the second impurity region, forming a second insulation interlayer on the first insulation interlayer and the first and second contact pads, forming a contact hole in the second insulation interlayer for exposing the first contact pad through the contact hole, and implanting a second impurity onto a bottom of the contact hole to thereby form a channel region below the first impurity region, wherein the first impurity region is surrounded by the channel region.

According to embodiments of the present invention, a channel doping region of a transistor contacts one of the impurity regions. Thus, a junction leakage current is reduced at the impurity regions that do not contact the channel-doping region. The semiconductor pattern on the substrate between the gate structures increases a contact area of a contact pad to minimize an electrical resistance of the contact pad and improve an operation characteristic of a DRAM device.

BRIEF DESCRIPTION OF THE DRAWINGS

Preferred embodiments of the present disclosure can be understood in more detail from the following descriptions taken in conjunction with the accompanying drawings in which.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
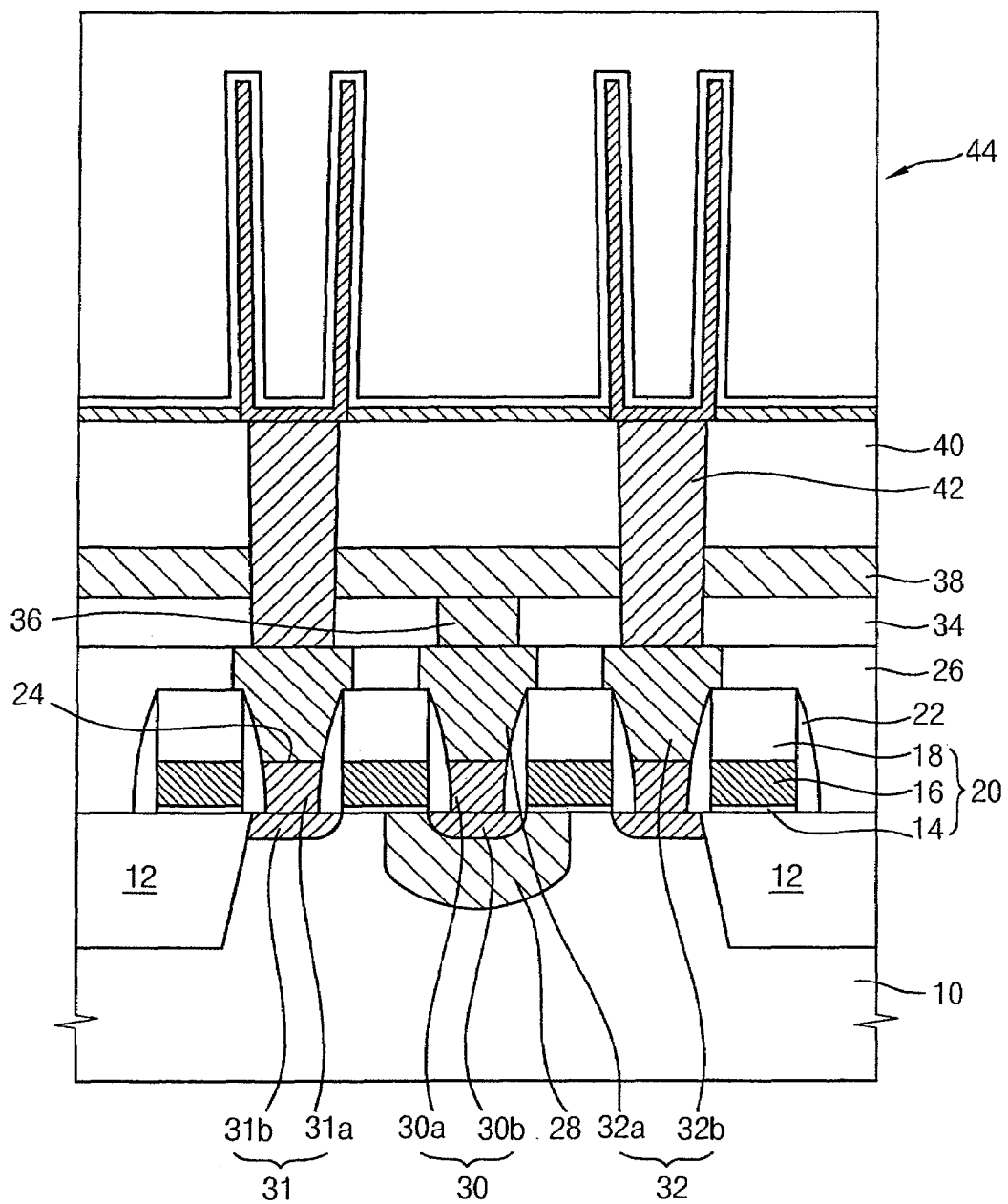
FIG. 1 is a cross sectional view illustrating a DRAM device including a planar gate electrode according to an embodiment of the present invention.

FIG. 1 is a cross sectional view illustrating a DRAM device including a planar gate electrode according to an embodiment of the present invention.

Referring to FIG. 1, a semiconductor substrate 10 such as a silicon wafer is separated into a field region 12 and an active region. A device isolation layer is formed in the field region 12 by a trench isolation process.

A gate structure 20 is formed on the active region of the substrate 10 as a linear pattern shape, and includes a gate insulation pattern 14, a gate conductive pattern 16 and a hard mask pattern 18 that are sequentially stacked on the substrate 10. The gate insulation pattern 14 comprises a silicon oxide. The gate conductive pattern 16 includes a polysilicon pattern, a composite pattern in which a polysilicon layer and a metal layer are sequentially stacked or a composite pattern in which a polysilicon layer and a metal silicide layer are sequentially stacked. The hard mask pattern 18 comprises a silicon nitride. A gate spacer 22 is formed to cover the side surface of the gate structure 20. In an embodiment of the present embodiment, the gate spacer 22 comprises a silicon nitride.

A semiconductor pattern 24 is formed on a surface of the substrate 10 between the gate spacers 22. A gap between two gate spacers 22 adjacent to each other is partially filled with the semiconductor pattern 24. First and second impurity regions 30 and 31 are formed on a surface and at surface portions of the substrate 10 corresponding to the semiconductor pattern 24. In an embodiment of the present invention, the first and second regions 30, 31 include N type impurities (or are doped with N type impurities), and function as source and drain regions of a transistor, respectively. The first impurity region 30 makes an electrical contact with a bit line, and the second impurity region 31 makes an electrical contact with a capacitor.

The N type impurities are heavily doped (or implanted) on the surface of the substrate 10 in the semiconductor pattern 24 in the first and second impurity regions 30 and 31, which are referred to as heavily doped regions 30a and 31a of the first and second impurity regions 30 and 31, respectively. The N type impurities are lightly doped at the surface portions of the substrate 10 below the semiconductor pattern 24 in the first and second impurity regions 30 and 31, which are referred to as lightly doped regions 30b and 31b of the first and second impurity regions 30 and 31, respectively. Lightly doped impurities in the lightly doped regions 30b and 31b reduce a reverse junction current to minimize a bulk leakage current.

A channel doping region 28 is formed below the first impurity region 30, so that the first impurity region 30 is surrounded by the channel doping region 28. In an embodiment of the present invention, the channel doping region 28 is heavily doped with P type impurities, and is spaced apart from the second impurity region 31.

A first insulation interlayer 26 is formed on the substrate 10 with a sufficient thickness to cover the gate structure 20, and a plurality of contact pads 32 is formed through the first insulation interlayer 26. Each of the contact pads 32 makes an electrical contact with the first impurity region 30 or the second impurity region 31. The contact pad 32 of an embodiment of the present invention makes contact with a surface of the semiconductor pattern 24, which is higher than the surface of the substrate 10. As a result, a contact area of the contact pad in an embodiment of the present invention is larger than that of a contact pad that contacts the surface of the substrate 10.

A second insulation interlayer 34 is formed on the first insulation interlayer 26 and the contact pads 32. A bit line contact 36 is formed through the second insulation interlayer 34, and contacts the contact pad 32. A bit line 38 is formed on the second insulation interlayer 34 and contacts the bit line contact 36.

A third insulation interlayer 40 is formed on the second insulation interlayer 34 with a sufficient thickness to cover the bit line 38. A storage node contact 42 is formed through the third insulation interlayer 40, and electrically contacts the second impurity region 31. A cylindrical capacitor 44 is formed on the storage node contact 42.

According to an embodiment of the present invention, the channel doping region 28 only surrounds the first impurity region 30, and does not surround the second impurity region 31. A threshold voltage of a gate in the transistor can be controlled by the P type impurities in the channel doping region 28 around the first impurity region 30. Since no P type impurities remain around the second impurity region 31, an intensity of an electric field can be reduced at a junction point crossing the second impurity region 31. Accordingly, a leakage current leaked from the junction point is reduced. Thus, the data retention time is increased and the refresh characteristic of the transistor is improved.

The first and second impurity regions 30 and 31 extend to surface portions of the semiconductor pattern 24 from the surface portions of the substrate 10. Thus, contact areas between the contact pads 32 and the first and second impurity regions 30 and 31 are increased as compared with a conventional technology. As a result, an electrical resistance between the contact pads 32 and the first and second impurity regions 30 and 31 is sufficiently reduced, thereby increasing a driving current for driving the transistor and the operation speed of the transistor.

FIGS. 2 to 6 are cross sectional views illustrating processing steps for manufacturing the DRAM device shown in FIG. 1 according to an embodiment of the present invention.

Figure 2:
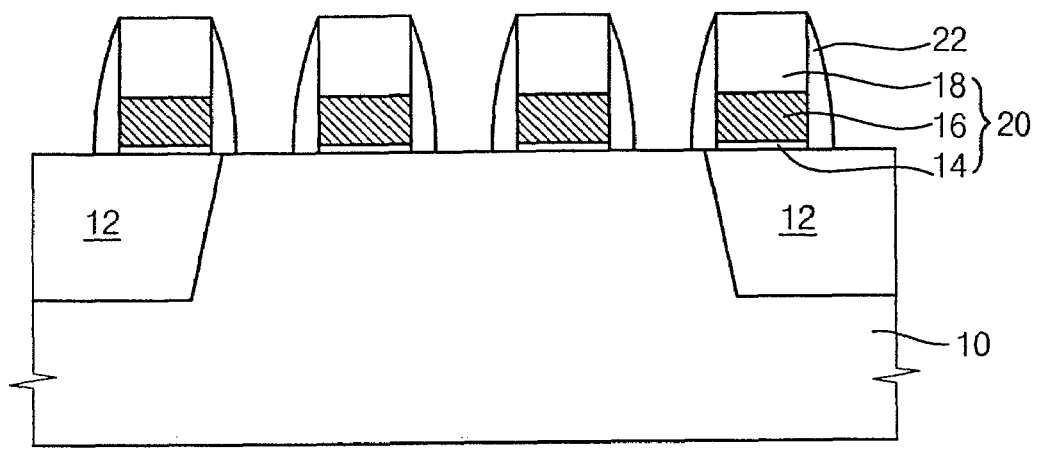
FIGS. 2 to 6 are cross sectional views illustrating processing steps for manufacturing the DRAM device shown in FIG. 1 according to an embodiment of the present invention.

Referring to FIG. 2, a semiconductor substrate 10 such as a silicon wafer is separated into a field region 12 and an active region by a trench isolation process. The field region 12 of the substrate 10 is etched to form a trench, and an isolation layer (or a field oxide layer) is formed in the trench, thus the active region of the substrate 10 is electrically isolated from surroundings by the isolation layer.

A thermal oxidation process is conducted on a surface of the substrate 10, and a gate oxide layer is formed on the surface of the substrate 10 as a gate insulation layer. A gate conductive layer is formed on the gate insulation layer, and a hard mask layer is formed on the gate conductive layer. The gate conductive layer includes a polysilicon layer or a composite layer having a polysilicon layer and a metal layer. The composite layer may include the polysilicon layer and a metal silicide layer in place of the metal layer. The hard mask layer comprises silicon nitride.

The hard mask layer is patterned to form a hard mask pattern 18, and the gate conductive layer and the gate insulation layer are etched using the hard mask pattern 18 as an etching mask to form a gate conductive pattern 16 and a gate insulation pattern 14. That is, the gate structure 20 includes the gate insulation pattern 14, the gate conductive pattern 16 and the hard mask pattern 18 that are stacked on the substrate 10.

A silicon nitride layer is coated on the substrate 10 with a sufficient thickness to cover the gate structure 20, and is anisotropically etched until a surface of the substrate 10 is exposed. Accordingly, a gate spacer 22 is formed on a sidewall of the gate structure 20.

Figure 3:
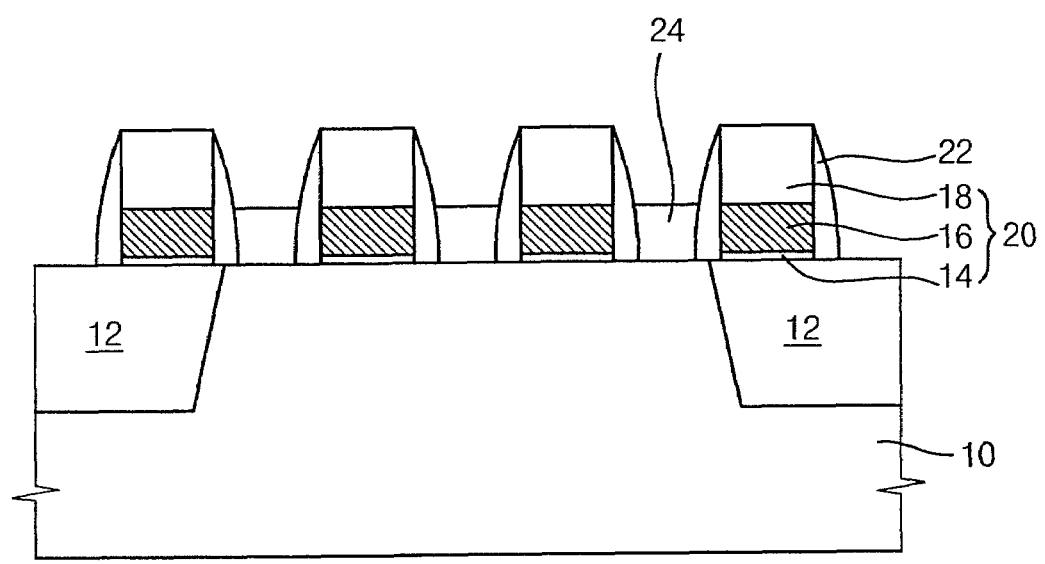

Referring to FIG. 3, a selective epitaxial growth (SEG) process is conducted on the exposed surface of the substrate 10 between the gate spacers 22 so that semiconductor materials are grown from the surface of the substrate 10 to form a semiconductor pattern 24. The SEG process selectively forms the semiconductor pattern 24 only on the exposed surface of the substrate 10. In an embodiment of the present invention, the semiconductor pattern 24 partially fills up a gap between the gate spacers 22. If the semiconductor pattern 24 fills up most of the gap between the gate spacers 22, a short circuit may be generated among the semiconductor patterns 24. The semiconductor pattern 24 may comprise silicon or silicon germanium, and may comprise the same material as the substrate 10.

Figure 4:
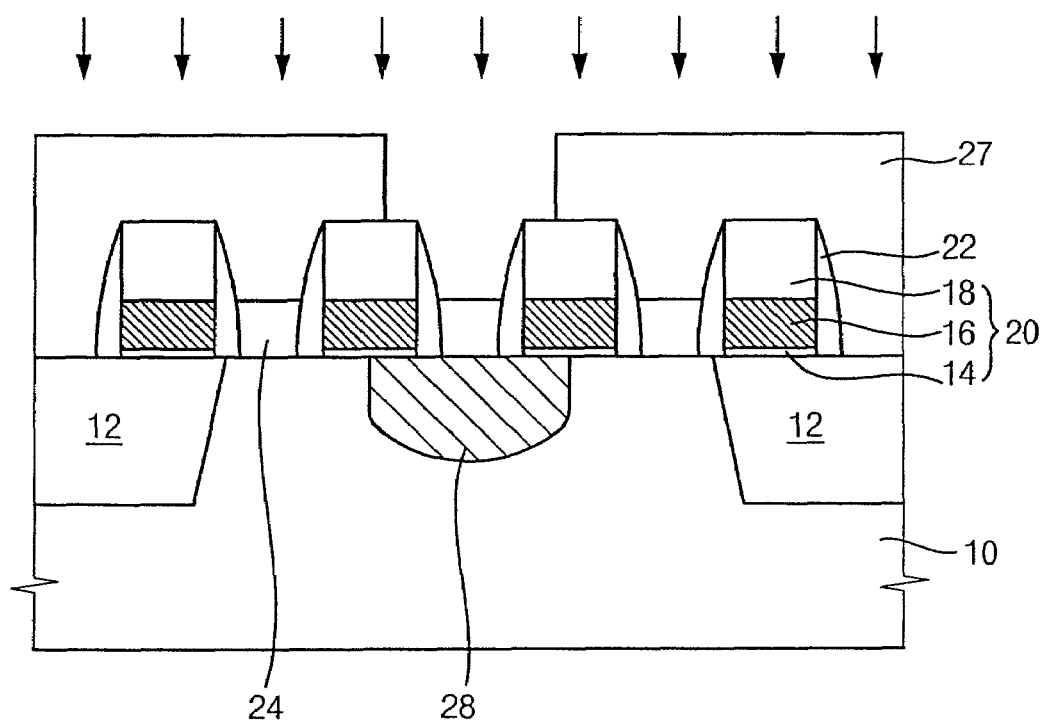

Referring to FIG. 4, a photoresist is coated on the substrate 10 including the semiconductor pattern 24 and the gate structure 20 to form a photoresist film on the substrate 10. The photoresist film is partially removed by exposing and developing processes to form a photoresist pattern 27. One of the semiconductor patterns 24 between the gate structures 20 is exposed through the photoresist pattern 27.

P type dopants are implanted at surface portions of the substrate 10 using the photoresist pattern 27 as an ion implantation mask to form a channel doping region 28 under the exposed semiconductor pattern 24. The channel doping region 28 is formed under the exposed semiconductor pattern 24 and under portions of the gate structures 20 that are adjacent to each other, and contacts the exposed semiconductor pattern 24. In a subsequent process, the exposed semiconductor pattern 24 on the channel doping region 28 makes an electrical contact with a bit line.

Figure 5:
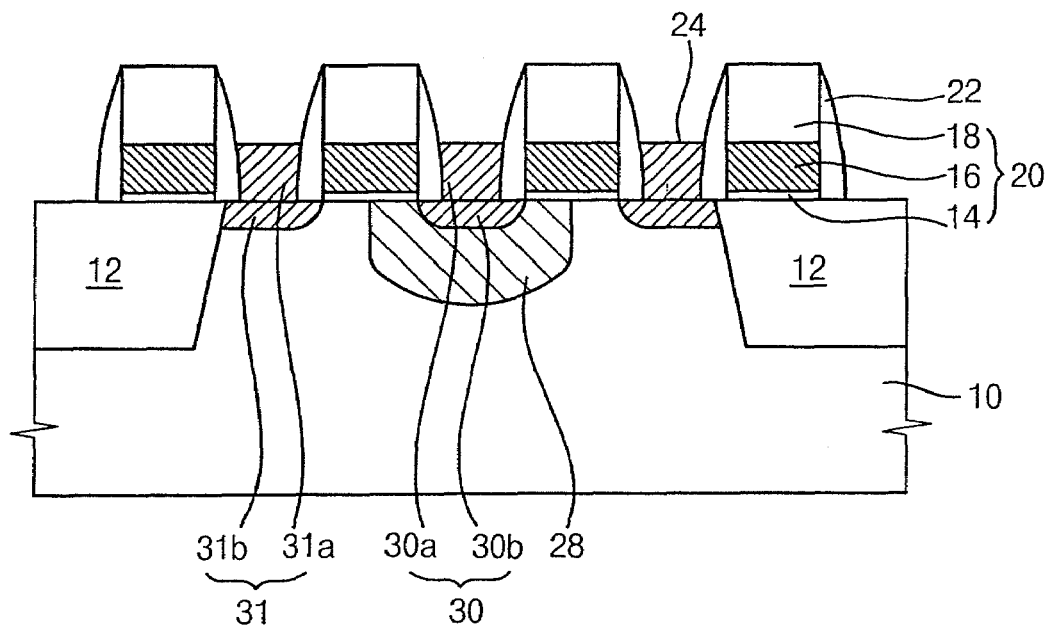

Referring to FIG. 5, the photoresist pattern 27 is removed by ashing and stripping processes. N type dopants are implanted onto the substrate 10 including the semiconductor pattern 24. Thus, first and second impurity regions 30 and 31 are formed in the semiconductor pattern 24 and at surface portions of the substrate 10 as source/drain regions of the transistor. The implantation of the N type dopants is controlled such that the first impurity region 30 is formed in the channel doping region 28 so that the first impurity region 30 is surrounded by the channel doping region 28.

In the first and second impurity regions 30 and 31, the N type dopants are heavily implanted onto the semiconductor pattern 24 that contacts a contact pad in a subsequent process, and are lightly implanted at the surface of the substrate 10. The N type dopants are lightly implanted onto the semiconductor pattern 24 and at the surface of the substrate 10 such that an implantation depth is higher than a bottom of the channel doping region 28. Then the N type dopants are heavily implanted at surface portions of the semiconductor pattern 24 to such a small implantation depth that the N type dopants are not implanted at the surface of the substrate 10.

The surface portions of the semiconductor pattern 24 are heavily doped with the N type dopants to minimize an electrical resistance of the contact pad. The surface portions of the substrate 10 are lightly doped with the N type dopants to thereby reduce a reverse junction current and decrease the junction leakage current. The first impurity region 30 makes electrical contact with a bit line in a subsequent process, and the second impurity region 31 makes electrical contact with a capacitor in a subsequent process.

When the substrate 10 is heat-treated, the implanted dopants are diffused to surroundings in the semiconductor pattern 24 and the substrate 10. In an embodiment of the present invention, the heat treatment process is controlled such that the channel doping region 28 does not contact the second impurity region 31 in the substrate 10 so that the channel doping region 28 only surrounds the first impurity region 30. As a result, the P type dopants scarcely remain around the second impurity region 31. Thus, an intensity of an electric field around the second impurity region 31 is reduced to minimize the junction leakage current. A threshold voltage of a transistor may be controlled by regulating an impurity concentration of the channel doping region 28 under the first impurity region 30.

Figure 6:
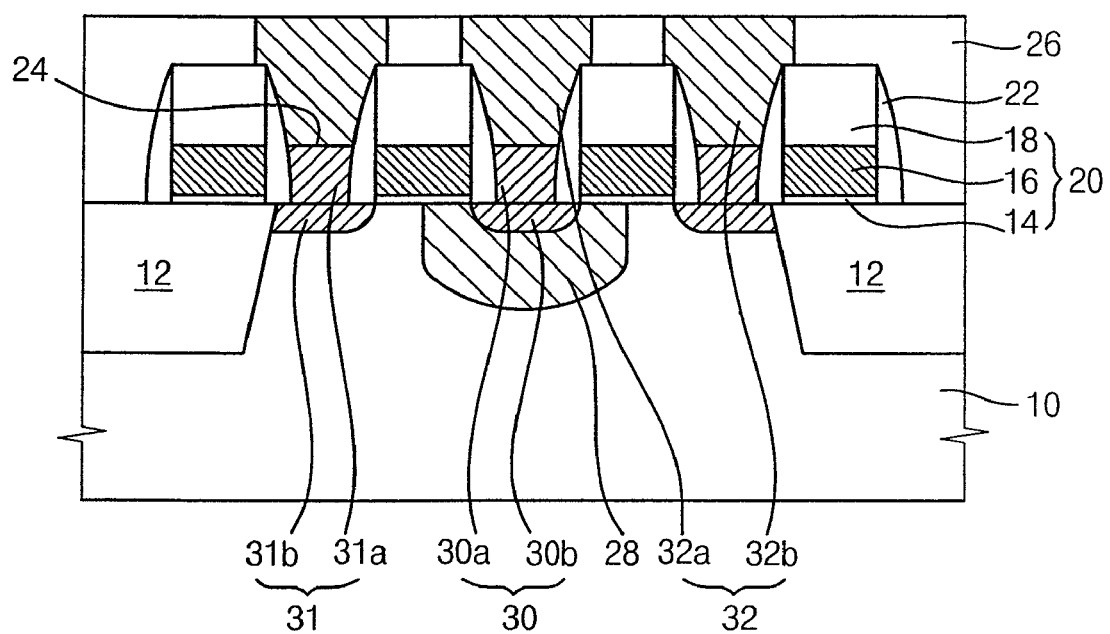

Referring to FIG. 6, a first insulation interlayer 26 is formed on the substrate 10 with a sufficient thickness to cover the gate structure 20, and is partially etched to form a first contact hole through which a surface of the semiconductor pattern 24 is exposed in the first and second impurity regions 30 and 31. A conductive material is coated on the first insulation interlayer 26 with a sufficient thickness to fill up the first contact hole to form a conductive layer (not shown) on the first insulation interlayer 26. The conductive layer is then removed and planarized until a surface of the first insulation interlayer 26 is exposed so that the conductive layer remains only in the first contact hole to form a plurality of contact pads 32 through the first insulation interlayer 26. Hereinafter, the contact pad 32 making electrical contact with the first impurity region 30 is referred to as a first contact pad 32a, and the contact pad 32 making an electrical contact with the second impurity region 31 is referred to as a second contact pad 32b. A surface area of the semiconductor pattern 24 is larger than that of the substrate 10 between the gate structures 20. Thus, the contact pad 32 has a smaller electrical resistance than when making direct contact with the substrate 10 between the gate structures 20. As a result, a driving current of the transistor is increased and an operation speed is also increased.

Referring to FIG. 1 again, a second insulation interlayer 34 is formed on the first insulation interlayer 26 and the contact pads 32, and is partially etched to form a second contact hole through which the first contact pad 32a is exposed. Then, a conductive layer is formed on the second insulation interlayer 34 with a sufficient thickness to fill up the second contact hole. The conductive layer is then patterned by a known method so that a bit line contact 36 making an electrical contact with the first contact pad 32a is formed in the second contact hole and a bit line 38 is formed to be connected to the bit line contact 36.

A third insulation interlayer 40 is formed on the second insulation interlayer 34, and the bit line 38 is covered with the third insulation interlayer 40. The third insulation interlayer 40 and the second insulation interlayer 34 are sequentially and partially etched to form a third contact hole through which the second contact pad 32b is exposed. A conductive layer is formed on the third insulation interlayer 40 with a sufficient thickness to fill up the third contact hole. The conductive layer is removed and planarized until the third insulation layer 40 is exposed so that the conductive layer remains in the third contact hole to form a storage node contact hole 42. A cylindrical capacitor 44 is formed on the storage node contact hole 42 to complete the DRAM device shown in FIG. 1.

FIGS. 7 to 11 are cross sectional views illustrating processing steps for manufacturing the DRAM device shown in FIG. 1 according to another embodiment of the present invention.

Figure 7:
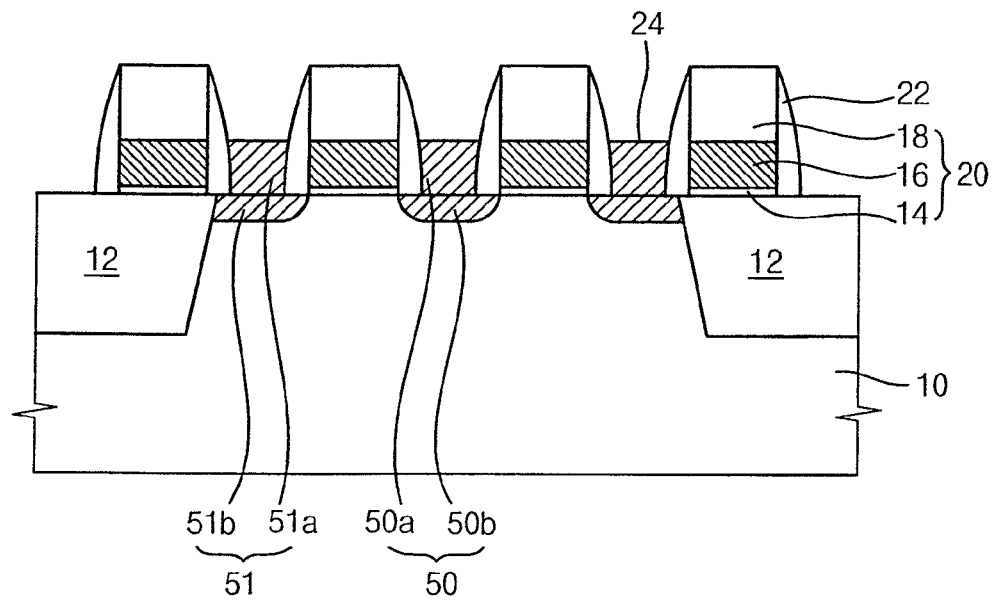
FIGS. 7 to 11 are cross sectional views illustrating processing steps for manufacturing the DRAM device shown in FIG. 1 according to another embodiment of the present invention.

Referring to FIG. 7, the same processing steps as described with reference to FIGS. 2 and 3 are performed. Briefly describing the processing steps above, a semiconductor substrate 10 is separated into a field region 12 and an active region by a trench device isolation process, and a gate structure 20 is formed on the substrate 10 such that the gate insulation pattern 14, the gate conductive pattern 16 and the hard mask pattern 18 are stacked. A gate spacer 22 is formed on a sidewall of the gate structure 20. A selective epitaxial growth (SEG) process is conducted on the exposed surface of the substrate 10 between the gate spacers 22 so that semiconductor materials are grown from the surface of the substrate 10 to form a semiconductor pattern 24. The SEG process selectively forms the semiconductor pattern 24 only on the exposed surface of the substrate 10.

N type dopants are implanted onto the substrate 10 including the semiconductor pattern 24. Thus, first and second impurity regions 50 and 51 are formed in the semiconductor pattern 24 and at surface portions of the substrate 10 as a source/drain of a transistor. In the first and second impurity regions 50 and 51, the N type dopants are heavily implanted onto the semiconductor pattern 24 that contacts a contact pad in a subsequent process. The N type dopants are lightly implanted at the surface of the substrate 10. Electrical resistance of the contact pad is minimized at the surface portions of the semiconductor pattern 24 due to the heavily doped N type dopants. A reverse junction current is reduced at the surface of the substrate 10 due to the lightly doped N type dopants, thereby decreasing the junction leakage current. The first impurity region 50 makes electrical contact with a bit line in a subsequent process, and the second impurity region 51 makes electrical contact with a capacitor in a subsequent process.

Figure 8:
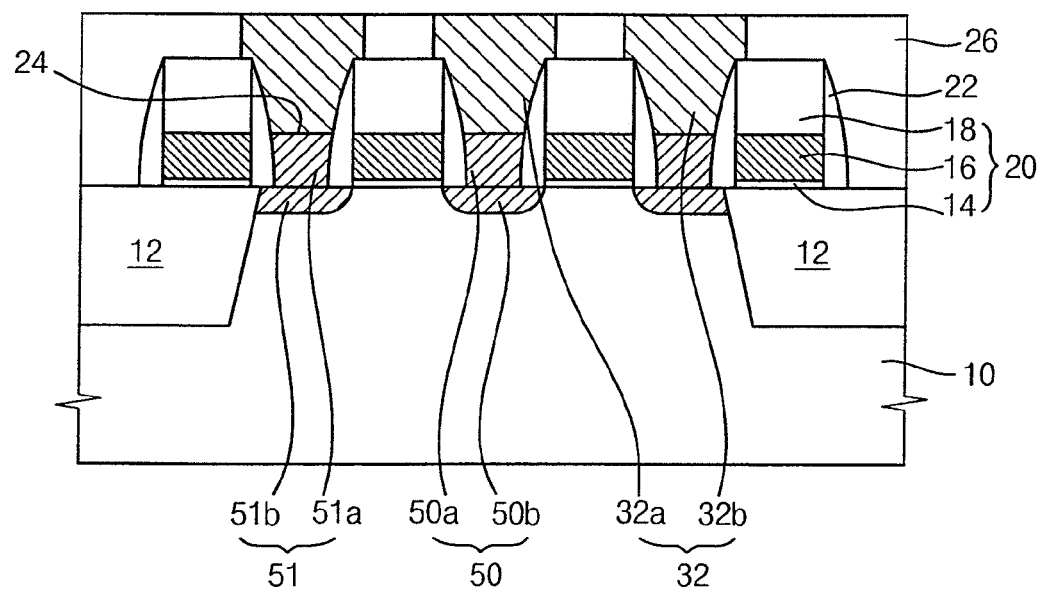

Referring to FIG. 8, a first insulation interlayer 26 is formed on the substrate 10 with a sufficient thickness to cover the gate structure 20, and is partially etched to form a first contact hole through which a surface of the semiconductor pattern 24 is exposed in the first and second impurity regions 50 and 51. A conductive material is coated on the first insulation interlayer 26 with a sufficient thickness to fill up the first contact hole to form a conductive layer on the first insulation interlayer 26. The conductive layer is removed and planarized until a surface of the first insulation interlayer 26 is exposed so that the conductive layer remains only in the first contact hole to thereby form a plurality of contact pads 32 through the first insulation interlayer 26. Hereinafter, the contact pad 32 making an electrical contact with the first impurity region 50 is referred to as a first contact pad 32a, and the contact pad 32 making an electrical contact with the second impurity region 51 is referred to as a second contact pad 32b. A surface area of the semiconductor pattern 24 is larger than that of the substrate 10 between the gate structures 20. Thus, the contact pad 32 has a smaller electrical resistance than when making direct contact with the substrate 10 between the gate structures 20. As a result, a driving current of the transistor is increased and an operation speed is also increased.

Figure 9:
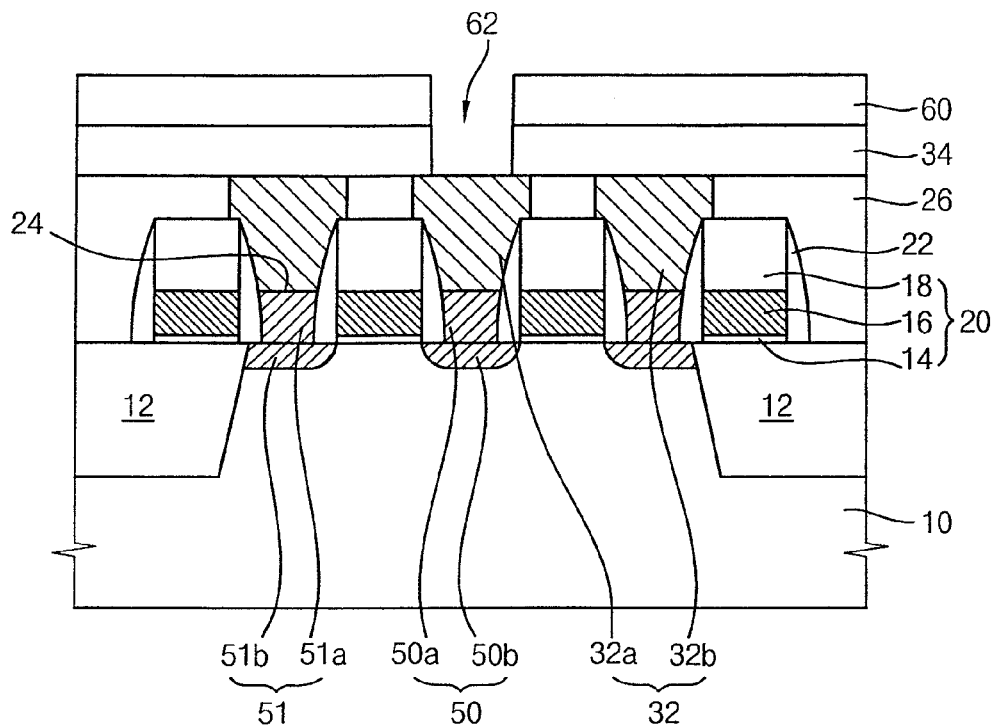

Referring to FIG. 9, a second insulation interlayer 34 is formed on the first insulation interlayer 26 and the contact pads 32. A photoresist film is coated on the second insulation interlayer 34, and a conventional exposing and developing processes are performed to form a photoresist pattern 60 through which a portion of the second insulation interlayer 34 corresponding to the first contact pad 32a is exposed. Then, the second insulation interlayer 34 is etched using the photoresist pattern as an etching mask to form a second contact hole 62 through which a top surface of the first contact pad 32a is exposed.

Figure 10:
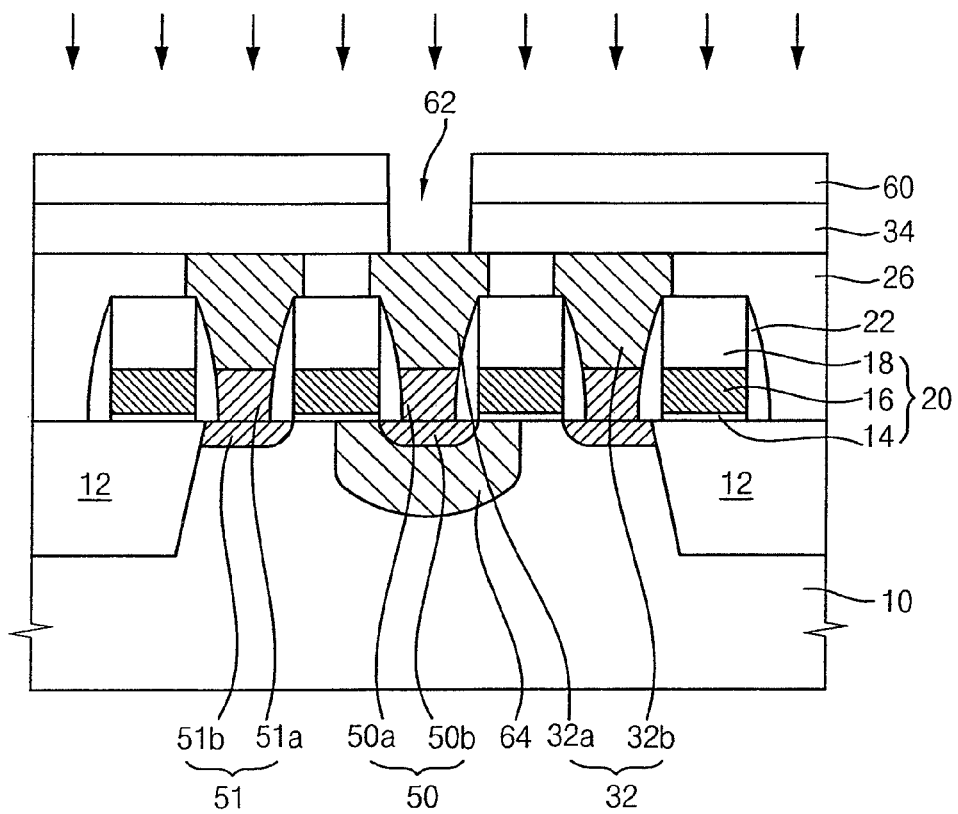

Referring to FIG. 10, a plurality of P type dopants are implanted onto the substrate 10 using the photoresist pattern 60 as an ion implantation mask so that a channel-doping region 64 is formed under the first impurity region 50. Here, the P type dopants are implanted to an implantation depth greater than a junction depth of the first impurity region 50 so that the channel-doping region 64 surrounds the first impurity region 50. Then, a heat-treating is conducted on the substrate 10 to diffuse the impurities in the substrate 10 so that the channel-doping region 64 does not contact the second impurity region 51.

In an embodiment of the present invention, the photoresist pattern 60 for forming the second contact hole 62 is used as the ion implantation mask for the channel doping region 64. Thus, unlike the previous embodiment, an additional photoresist pattern for forming the channel doping region 64 is not needed.

Figure 11:
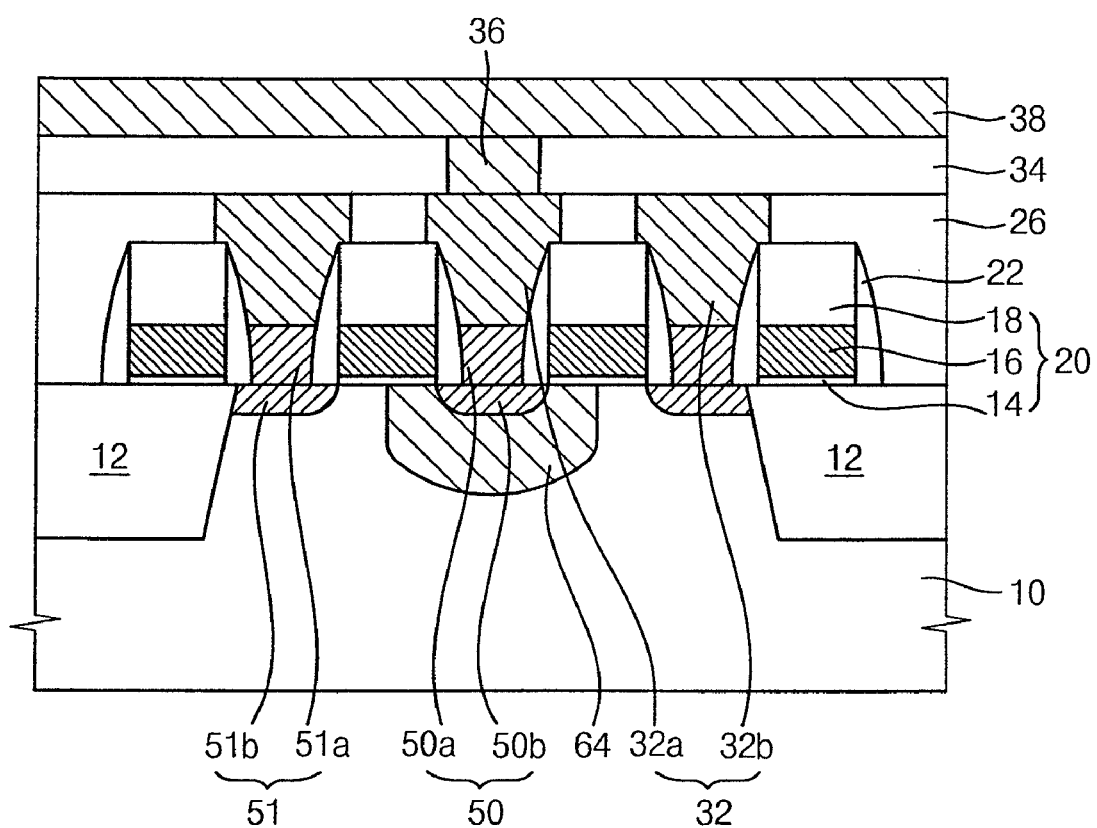

Referring to FIG. 11, the photoresist pattern 60 is removed by ashing and stripping processes, and a conductive layer is formed on the second insulation interlayer 34 with a sufficient thickness to fill up the second contact hole 62. The conductive layer is then patterned so that a bit line contact 36 making an electrical contact with the first contact pad 32a is formed in the second contact hole 62, and a bit line 38 is formed to be connected to the bit line contact 36.

A third insulation interlayer 40 is formed on the second insulation interlayer 34, and the bit line 38 is covered with the third insulation interlayer 40 as shown in FIG. 1. The third insulation interlayer 40 and the second insulation interlayer 34 are sequentially and partially etched to thereby form a third contact hole through which the second contact pad 32b is exposed. A conductive layer is formed on the third insulation interlayer 40 with a sufficient thickness to fill up the third contact hole, and the conductive layer is removed and planarized until the third insulation layer 40 is exposed so that the conductive layer remains in the third contact hole to form a storage node contact hole 42. A cylindrical capacitor 44 is formed on the storage node contact hole 42 to complete the DRAM device shown in FIG. 1.

According to an embodiment of the present invention, an additional photoresist pattern for forming the channel doping region is not required.

Figure 12:
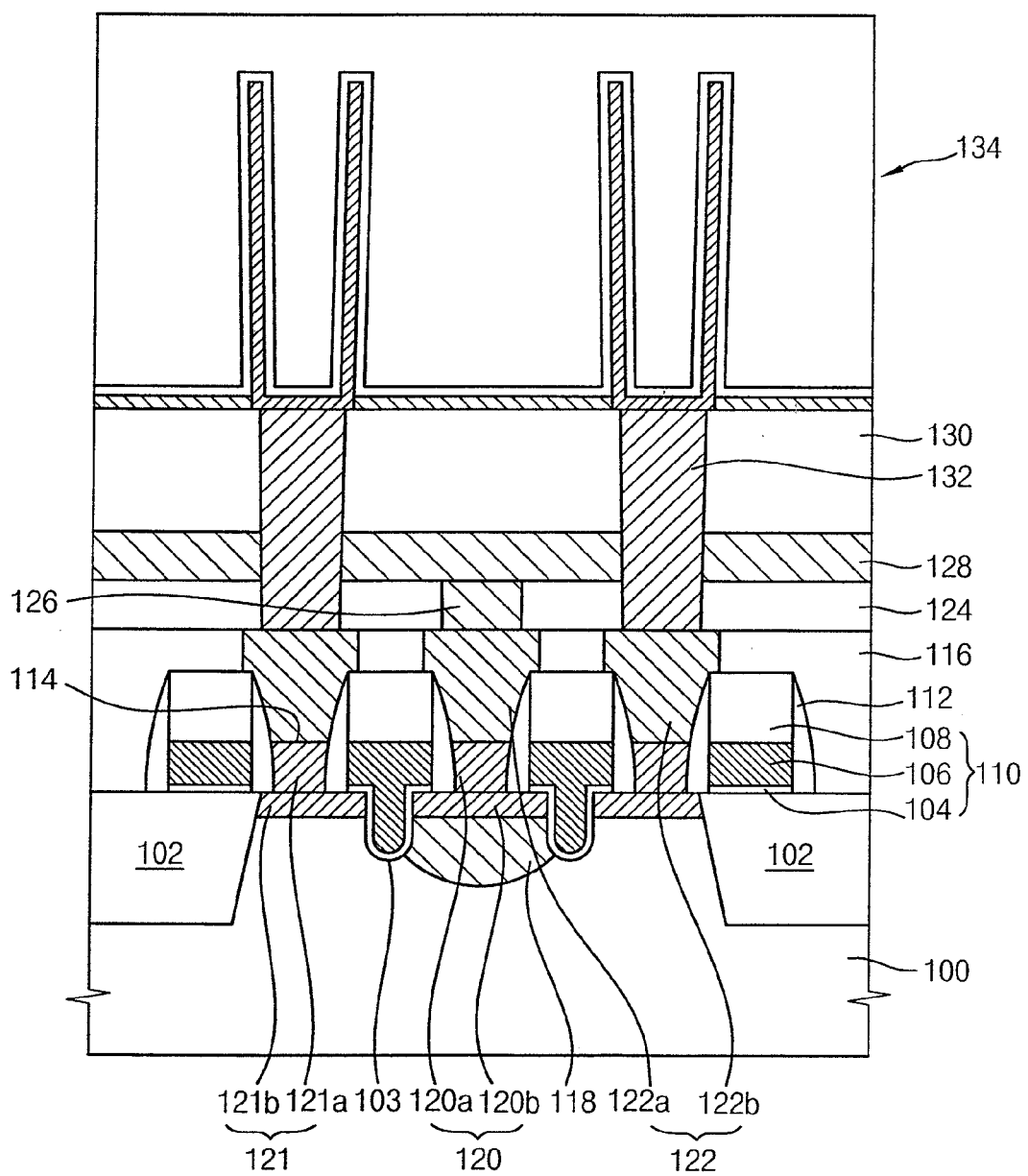
FIG. 12 is a cross sectional view illustrating a DRAM device including a recessed gate electrode according to an embodiment of the present invention.

FIG. 12 is a cross sectional view illustrating a DRAM device including a recessed gate electrode according to an embodiment of the present invention.

Referring to FIG. 12, a semiconductor substrate 100 such as a silicon wafer is separated into a field region 102 and an active region by a trench isolation process. The field region 102 of the substrate 100 is etched to form a field trench, and an isolation layer is formed in the field trench. Thus, the active region of the substrate 100 is electrically isolated from surroundings by the device isolation layer.

A gate trench 103 is recessed from a surface of the substrate 100, and a gate electrode is formed in the gate trench in a subsequent process. A gate insulation layer is formed on the substrate 100 and on an inner surface of the gate trench 103, and then a gate conductive layer is formed on the gate insulation layer. A hard mask layer is formed on the gate conductive layer. The gate insulation layer comprises silicon oxide, and the gate conductive layer includes a polysilicon layer or a composite layer having a polysilicon layer and a metal layer. The composite layer may include the polysilicon layer and a metal silicide layer in place of the metal layer. The hard mask layer comprises silicon nitride.

The hard mask layer is patterned to form a hard mask pattern 108, and the gate conductive layer and the gate insulation layer are etched using the hard mask pattern 108 as an etching mask to form a gate conductive pattern 106 and a gate insulation pattern 104. That is, the gate insulation pattern 104, the gate conductive pattern 106 and the hard mask pattern 108 that are sequentially stacked on the substrate 100 to complete a gate structure 110. A gate spacer 112 is formed along a sidewall of the gate structure 110 on the substrate 100, and comprises a silicon nitride.

A selective epitaxial growth (SEG) process is conducted on the exposed surface of the substrate 100 between the gate spacers 112 so that semiconductor materials are grown from the surface of the substrate 100 to form a semiconductor pattern 114. The SEG process selectively forms the semiconductor pattern 114 only on the exposed surface of the substrate 100 between the gate spacers 112. Thus, the semiconductor pattern 114 partially fills up a gap between the gate spacers 112.

A plurality of N type dopants are implanted onto the substrate 100 including the semiconductor pattern 114.; Thus, first and second impurity regions 120 and 121 are formed in the semiconductor pattern 114 and at surface portions of the substrate 100 as a source/drain of a transistor. In the first and second impurity regions 120 and 121, the N type dopants are heavily implanted onto the semiconductor pattern 114 that contacts a contact pad in a subsequent process, and are lightly implanted at the surface of the substrate 100.

The surface portions of the semiconductor pattern 114 are heavily doped with the N type dopants and minimize an electrical resistance of the contact pad. The surface of the substrate 100 is lightly doped with the N type dopants to reduce a reverse junction current and decrease the junction leakage current. The first impurity region 120 makes an electrical contact with a bit line in a subsequent process, and the second impurity region 121 makes an electrical contact with a capacitor in a subsequent process. Then, a plurality of P type dopants are implanted at the surface of the substrate 100 to form a channel doping region 118 under the first impurity region 120, spaced apart from the second impurity region 121 by a predetermined distance.

A first insulation interlayer 116 is formed on the substrate 100 with a sufficient thickness to cover the gate structure 110, and is partially etched to form a first contact hole through which a surface of the semiconductor pattern 114 is exposed in the first and second impurity regions 120 and 121.

A conductive material is coated on the first insulation interlayer 116 to with sufficient thickness to fill up the first contact hole to form a conductive layer (not shown) on the first insulation interlayer 116. The conductive layer is then removed and planarized until a surface of the first insulation interlayer 116 is exposed so that the conductive layer remains only in the first contact hole to form a plurality of contact pads 122 through the first insulation interlayer 116. Hereinafter, the contact pad 122 making an electrical contact with the first impurity region 120 is referred to as a first contact pad 122a, and the contact pad 122 making an electrical contact with the second impurity region 121 is referred to as a second contact pad 122b. A surface area of the semiconductor pattern 114 is larger than that of the substrate 100 between the gate structures 110. Thus, the contact pad 122 has a smaller electrical resistance than when making direct contact with the substrate 100 between the gate structures 110. As a result, a driving current of the transistor and an operation speed of the transistor are increased.

A second insulation interlayer 124 is formed on the first insulation interlayer 116 and the contact pads 122, and is partially etched to form a second contact hole through which the first contact pad 122a is exposed. Then, a conductive layer is formed on the second insulation interlayer 124 with a sufficient thickness to fill up the second contact hole. The conductive layer is then patterned so that a bit line contact 126 making an electrical contact with the first contact pad 122a is formed in the second contact hole and a bit line 128 is formed to be connected to the bit line contact 126.

A third insulation interlayer 130 is formed on the second insulation interlayer 124, and the bit line 128 is covered with the third insulation interlayer 130. The third insulation interlayer 130 and the second insulation interlayer 124 are sequentially and partially etched to thereby form a third contact hole through which the second contact pad 122b is exposed. A conductive layer is formed on the third insulation interlayer 130 with a sufficient thickness to fill up the third contact hole. The conductive layer is removed and planarized until the third insulation layer 130 is exposed so that the conductive layer remains in the third contact hole to form a storage node contact hole 132. A cylindrical capacitor 134 is formed on the storage node contact hole 132 to complete the DRAM device shown in FIG. 12.

According to an embodiment of the present invention, the semiconductor pattern is formed on the substrate between the gate structures. Thus, the first and second impurity regions are extended to the semiconductor pattern from the substrate. Therefore, operation characteristics of the transistor are not deteriorated although the depth of the gate trench is smaller than the conventional recessed gate trench. When the depth of the gate trench is reduced, a surface area of the gate insulation layer is reduced to minimize a word line loading effect.

Figure 13:
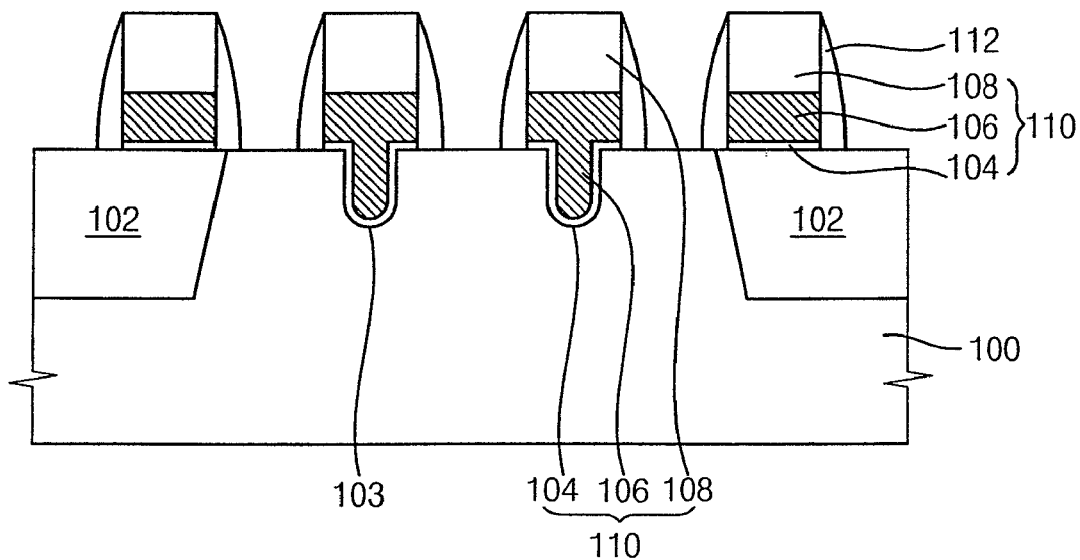
FIGS. 13 to 15 are cross sectional views illustrating processing steps for manufacturing the DRAM device shown in FIG. 12 according to an embodiment of the present invention.
Figure 14:
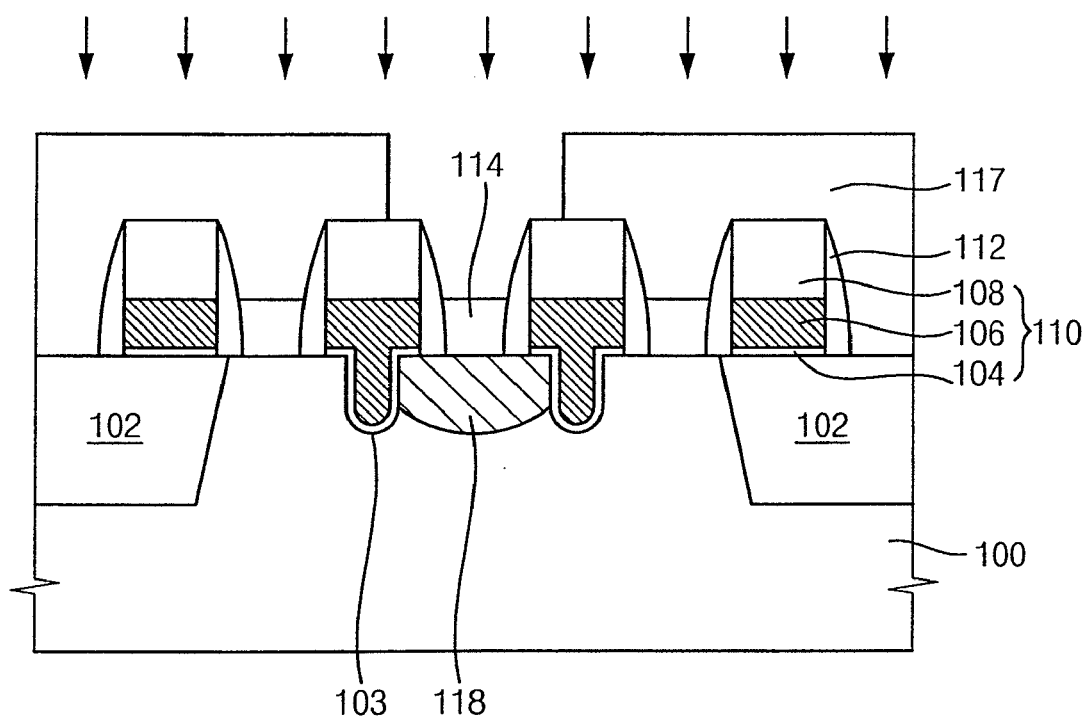
Figure 15:
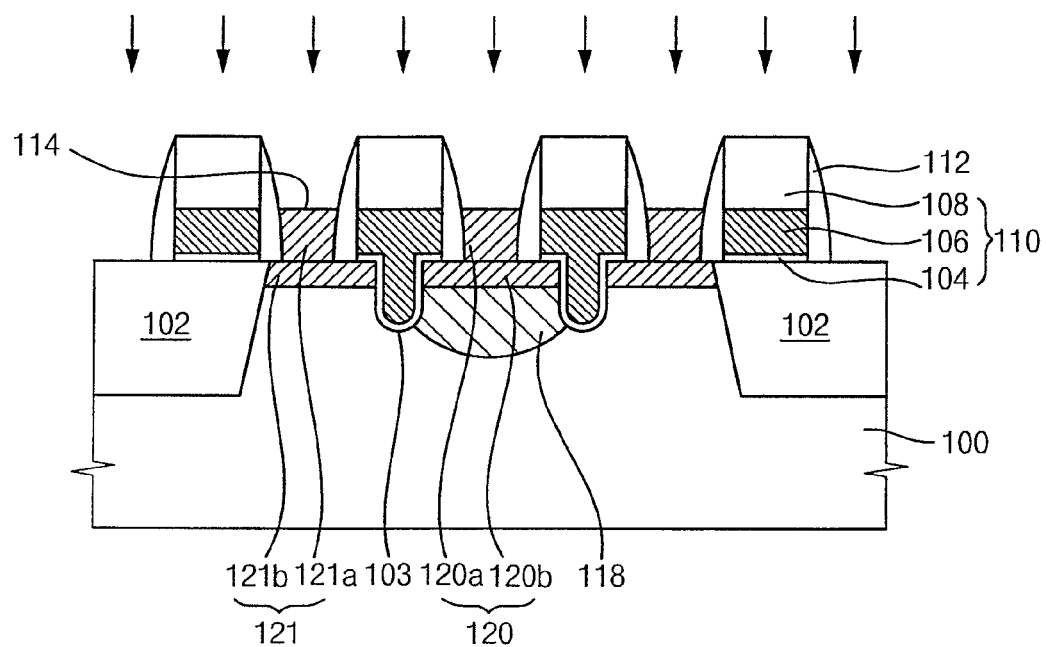

FIGS. 13 to 15 are cross sectional views illustrating processing steps for manufacturing the DRAM device shown in FIG. 12 according to an embodiment of the present invention. The processing steps of the present embodiment are substantially identical to those described in connection with FIGS. 2-6 except that the gate electrode is formed in the gate trench to form a recessed transistor.

Referring to FIG. 13, a semiconductor substrate 100 such as a silicon wafer is separated into a field region 102 and an active region by a trench device isolation process. The field region of the substrate 100 is etched to form a trench, and an isolation layer is formed in the trench. Thus, the active region of the substrate 100 is electrically isolated from surroundings by the device isolation layer.

A portion of the active region of the substrate 100 is selectively etched away and recessed to a predetermined depth to form a gate trench 103 in which a gate electrode is formed in a subsequent process. Then, silicon oxide is formed on the substrate 100 and on an inner surface of the gate trench 103 as a gate insulation layer. A gate conductive layer is formed on the gate insulation layer, and a hard mask layer is formed on the gate conductive layer.

The hard mask layer is patterned to form a hard mask pattern 108, and the gate conductive layer and the gate insulation layer are partially etched using the hard mask pattern 108 as an etching mask to form a gate conductive pattern 106 and a gate insulation pattern 104. As a result, the gate insulation pattern 104, the gate conductive pattern 106 and the hard mask pattern 108 are sequentially stacked on the substrate 100 to complete a gate structure 110.

Silicon nitride is coated on the substrate 100 with a sufficient thickness to cover the gate structure 110, and is anisotropically etched until a surface of the substrate 100 is exposed. Accordingly, a gate spacer 112 is formed on a sidewall of the gate structure 110.

Referring to FIG. 14, a selective epitaxial growth (SEG) process is conducted on the exposed surface of the substrate 100 between the gate spacers 112 so that semiconductor materials are grown from the surface of the substrate 100 to form a semiconductor pattern 114. A photoresist is coated on the substrate 100 including the semiconductor pattern 114 and the gate structure 110 to form a photoresist film (not shown) on the substrate 100, and the photoresist film is partially removed by exposing and developing processes to form a photoresist pattern 117. One of the semiconductor patterns 114 between the gate structures 110 is exposed through the photoresist pattern 117.

Then, a plurality of P type dopants are implanted at the surface of the substrate 100 using the photoresist pattern 117 as an ion implantation mask to form a channel doping region 118 under the exposed semiconductor pattern 114. Accordingly, the channel doping region 118 is formed under the exposed semiconductor pattern 114 and between the gate trenches 103 that are adjacent to each other.

Referring to FIG. 15, the photoresist pattern 117 is removed by known ashing and strip processes. A plurality of N type dopants is implanted onto the substrate 100 including the semiconductor pattern 114. Thus, first and second impurity regions 120 and 121 are formed in the semiconductor pattern 114 and at surface portions of the substrate 100 as source/drain of a transistor. The implantation of the N type dopants is controlled such that the first impurity region 120 is formed on the channel doping region 118 between the gate trenches 103 so that the first impurity region 120 is surrounded by the channel doping region 118 and the gate trenches 103.

In the first and second impurity regions 120 and 121, the N type dopants are heavily implanted onto the semiconductor pattern 114 that contacts a contact pad in a subsequent process, and are lightly implanted at the surface of the substrate 100.

Thereafter, the above processing steps described with reference to FIGS. 1 and 6 are sequentially performed so that a bit line contacting the first impurity region 120 and a capacitor contacting the second impurity region 121 are formed on the substrate 100 to complete the DRAM device shown in FIG. 12.

Figure 16:
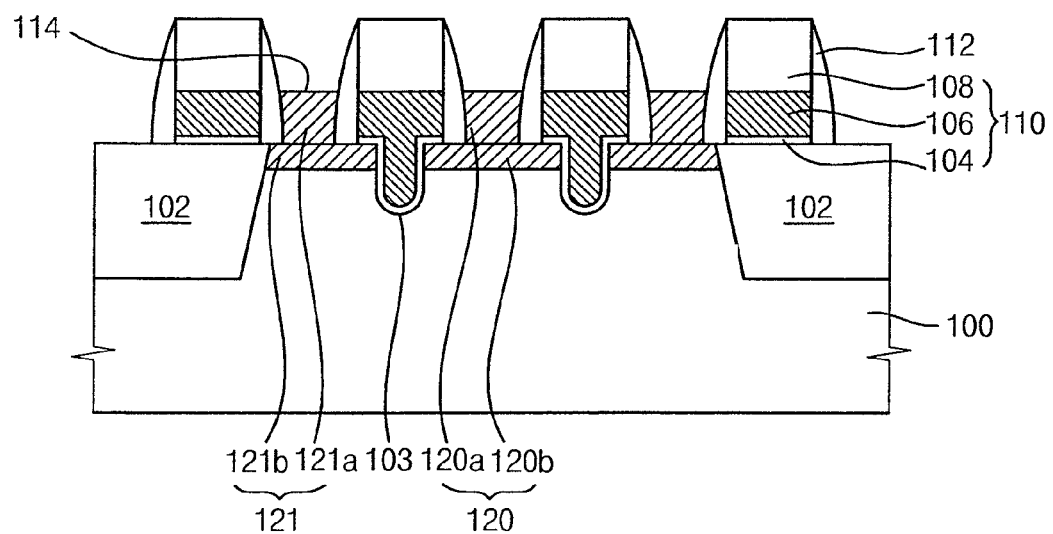
FIGS. 16 and 17 are cross sectional views illustrating processing steps for manufacturing the DRAM device shown in FIG. 12 according to another embodiment of the present invention.
Figure 17:
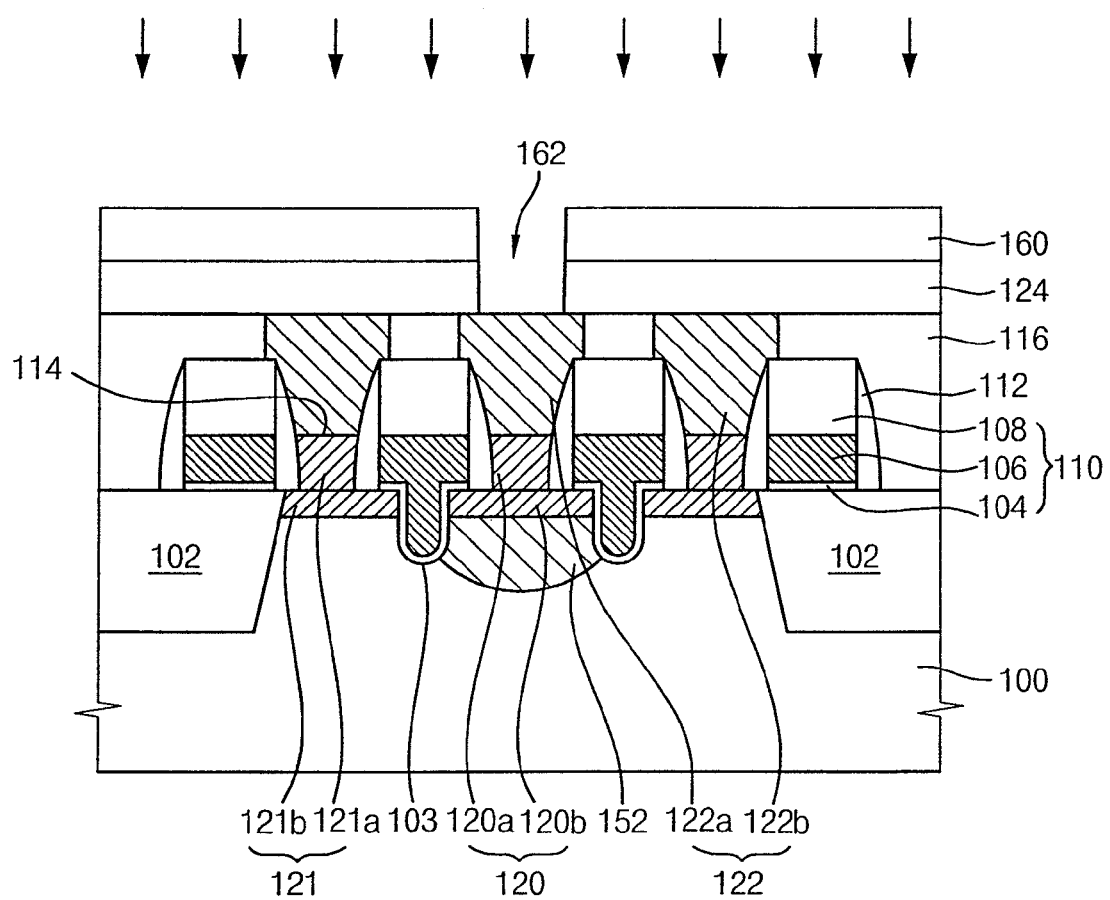

FIGS. 16 and 17 are cross sectional views illustrating processing steps for manufacturing the DRAM device shown in FIG. 12 according to another embodiment of the present invention. The processing steps of the present embodiment are substantially identical to those described in connection with FIGS. 7-11 except that the gate electrode is formed in the gate trench to form a recessed transistor.

Referring to FIG. 16, a gate structure 110 is formed in the gate trench 103 of the semiconductor substrate 100 through the same processing steps as described above with respect to FIG. 13. Then, a gate spacer 112 is formed on a sidewall of a portion of the gate structure 110 protruded from the substrate 100. A semiconductor pattern 114 is formed on the substrate 100 between the gate spacers 112 by a SEG process.

Then, N type dopants are implanted onto the substrate 100 including the semiconductor pattern 114. Thus, first and second impurity regions 120 and 121 are formed in the semiconductor pattern 114 and at surface portions of the substrate 100 as a source/drain of a transistor. In the first and second impurity regions 120 and 121, the N type dopants are heavily implanted onto the semiconductor pattern 114 that contacts a contact pad in a subsequent process, and are lightly implanted at the surface of the substrate 100. An electrical resistance of the contact pad is minimized at the surface portions of the semiconductor pattern 114 due to the heavily doped N type dopants, and a reverse junction current is reduced at the surface of the substrate 100 due to the lightly doped N type dopants. As a result, the junction leakage current is decreased.

Referring to FIG. 17, a first insulation interlayer 116 is formed on the substrate 100 with a sufficient thickness to cover the gate structure 110, and is partially etched to form a first contact hole through which a surface of the semiconductor pattern 114 is exposed in the first and second impurity regions 120 and 121. A conductive material is coated on the first insulation interlayer 116 to a sufficient thickness to fill up the first contact hole to form a conductive layer on the first insulation interlayer 116. The conductive layer is then removed and planarized until a surface of the first insulation interlayer 116 is exposed so that the conductive layer remains only in the first contact hole to form a plurality of contact pads 122 through the first insulation interlayer 116. Hereinafter, the contact pad 122 making an electrical contact with the first impurity region 120 is referred to as a first contact pad 122a, and the contact pad 122 making an electrical contact with the second impurity region 121 is referred to as a second contact pad 122b. A surface area of the semiconductor pattern 114 is larger than that of the substrate 100 between the gate structures 110. Thus, the contact pad 122 has a smaller electrical resistance than when making direct contact with the substrate 100 between the gate structures 110. As a result, a driving current of the transistor is increased and an operation speed is also increased. In an embodiment of the present invention, the conductive material comprises polysilicon.

Then, a second insulation interlayer 124 is formed on the first insulation interlayer 116 and the contact pads 122. A photoresist film is coated on the second insulation interlayer 124, and exposing and developing processes are performed to form a photoresist pattern 160 through which a portion of the second insulation interlayer 124 corresponding to the first contact pad 122a is exposed. Then, the second insulation interlayer 124 is etched using the photoresist pattern 160 as an etching mask to form a second contact hole 162 through which a top surface of the first contact pad 122a is exposed.

A plurality of P type dopants are implanted onto the substrate 100 using the photoresist pattern 160 as an ion implantation mask so that a channel-doping region 152 is formed under the first impurity region 120. Here, the P type dopants are implanted to an implantation depth greater than a junction depth of the first impurity region 120 so that the channel-doping region 152 surrounds the first impurity region 120 between the gate trenches 103 adjacent to each other. Thereafter, the above processing steps described with reference to FIG. 11 are performed to complete the DRAM device shown in FIG. 12.

FIGS. 18 to 22 are cross sectional views illustrating processing steps for manufacturing a DRAM device according to still another exemplary embodiment of the present invention.

Figure 18:
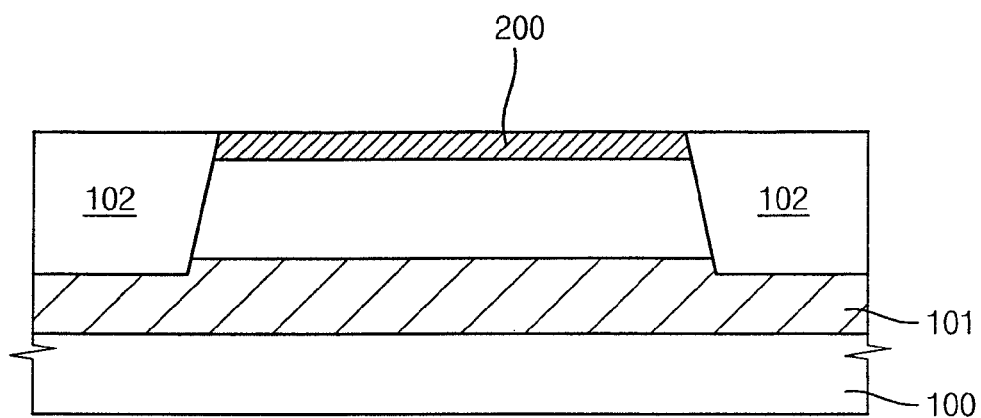
FIGS. 18 to 22 are cross sectional views illustrating processing steps for manufacturing a DRAM device according to still another embodiment of the present invention.

Referring to FIG. 18, a semiconductor substrate 100 such as a silicon wafer is separated into a field region 102 and an active region by a trench isolation process. The field region 102 of the substrate 100 is etched to form a field trench, and an isolation layer is formed in the field trench. The active region of the substrate 100 is electrically isolated from surroundings by the isolation layer in the field trench of the field region 102.

A plurality of P type dopants are deeply implanted onto the substrate 100 to form a field impurity region 101 under the field region 102, and a plurality of N type dopants are shallowly implanted onto the substrate 100 to form an active impurity region 200 at surface portions of the active region of the substrate 100. Alternatively, the processing step for forming the active impurity region 200 may be omitted.

Figure 19:
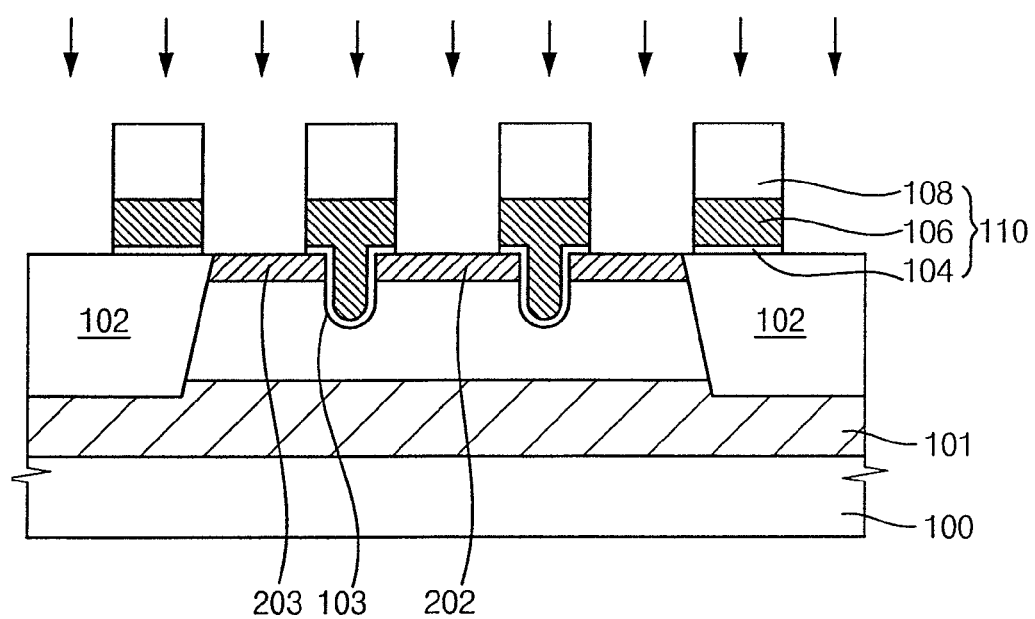

Referring to FIG. 19, a portion of the active region of the substrate 100 is selectively etched away and recessed to a predetermined depth to form a gate trench 103 in which a gate electrode is formed in a subsequent process and to separate the active impurity region 200 into parts. Then, silicon oxide is formed on the substrate 100 and on an inner surface of the gate trench 103 as a gate insulation layer. A gate conductive layer is formed on the gate insulation layer, and a hard mask layer is formed on the gate conductive layer.

The hard mask layer is patterned to form a hard mask pattern 108, and the gate conductive layer and the gate insulation layer are partially etched using the hard mask pattern 108 as an etching mask to form a gate conductive pattern 106 and a gate insulation pattern 104. As a result, the gate insulation pattern 104, the gate conductive pattern 106 and the hard mask pattern 108 are sequentially stacked on the substrate 100 to complete a gate structure 110.

A plurality of additional N type dopants are heavily implanted onto the separated active impurity region 200 to form first and second impurity regions 202 and 203 as a source/drain of a transistor.

Figure 20:
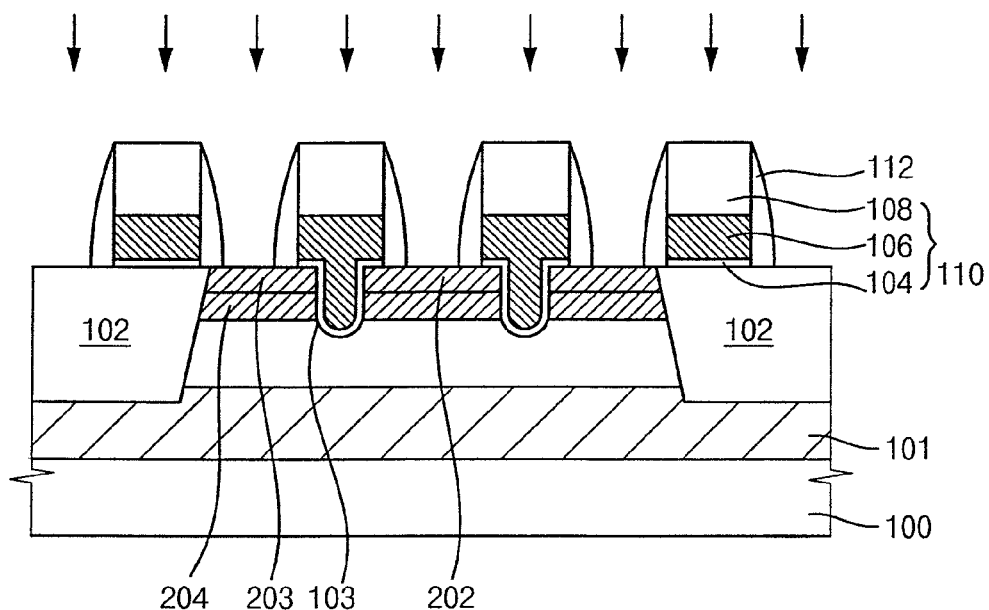

Referring to FIG. 20, a gate spacer 112 is formed on a sidewall of a portion of the gate structure 110 protruded from the substrate 100. A plurality of additional N type dopants are lightly implanted onto the substrate 100 including the gate spacer 112 to form a lightly doped impurity region 204 below the first and second impurity regions 202 and 203. The lightly doped impurity region 204 is formed at a position deeper than the first and second impurity regions 202 and 203 and shallower than a bottom of the gate trench 103. Alternatively, the processing step for forming the lightly doped impurity region 204 may be omitted.

Figure 21:
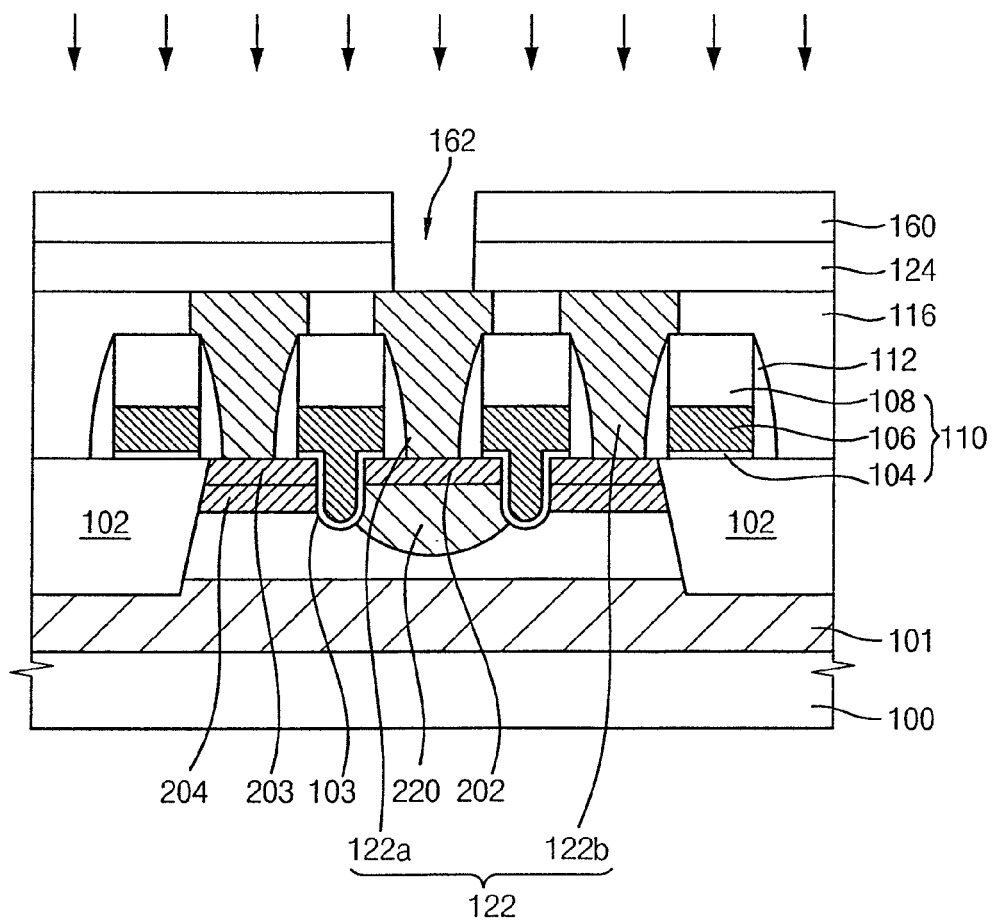

Referring to FIG. 21, a first insulation interlayer 116 is formed on the substrate 100 with a sufficient thickness to cover the gate structure 110, and is partially etched to form a first contact hole through which surfaces of the first and second impurity regions 202 and 203 are exposed. A conductive material is coated on the first insulation interlayer 116 to a sufficient thickness to fill up the first contact hole to form a conductive layer (not shown) on the first insulation interlayer 116. The conductive layer is then removed and planarized until a surface of the first insulation interlayer 116 is exposed so that the conductive layer remains only in the first contact hole to form a plurality of contact pads 122 through the first insulation interlayer 116. Hereinafter, the contact pad 122 making an electrical contact with the first impurity region 202 is referred to as a first contact pad 122a, and the contact pad 122 making an electrical contact with the second impurity region 203 is referred to as a second contact pad 122b. In an embodiment of the present invention, the conductive material comprises polysilicon.

A second insulation interlayer 124 is formed on the first insulation interlayer 116 and the contact pads 122, and a photoresist film (not shown) is formed on the second insulation interlayer 124. The photoresist film is partially removed by known exposing and developing processes to form a photoresist pattern 128, through which the second insulation interlayer 124 is partially exposed corresponding to the first contact pad 122a. The second insulation interlayer 124 is then etched away using the photoresist pattern as an etching mask to form a second contact hole 162 through which a top surface of the second contact pad 122a is exposed. A plurality of P type dopants is implanted at surface portions of the substrate 100 using the photoresist pattern 160 as an ion implantation mask to a depth greater than a junction depth of the first impurity region 202 to form a channel doping region 220 under the first impurity region 202.

Figure 22:
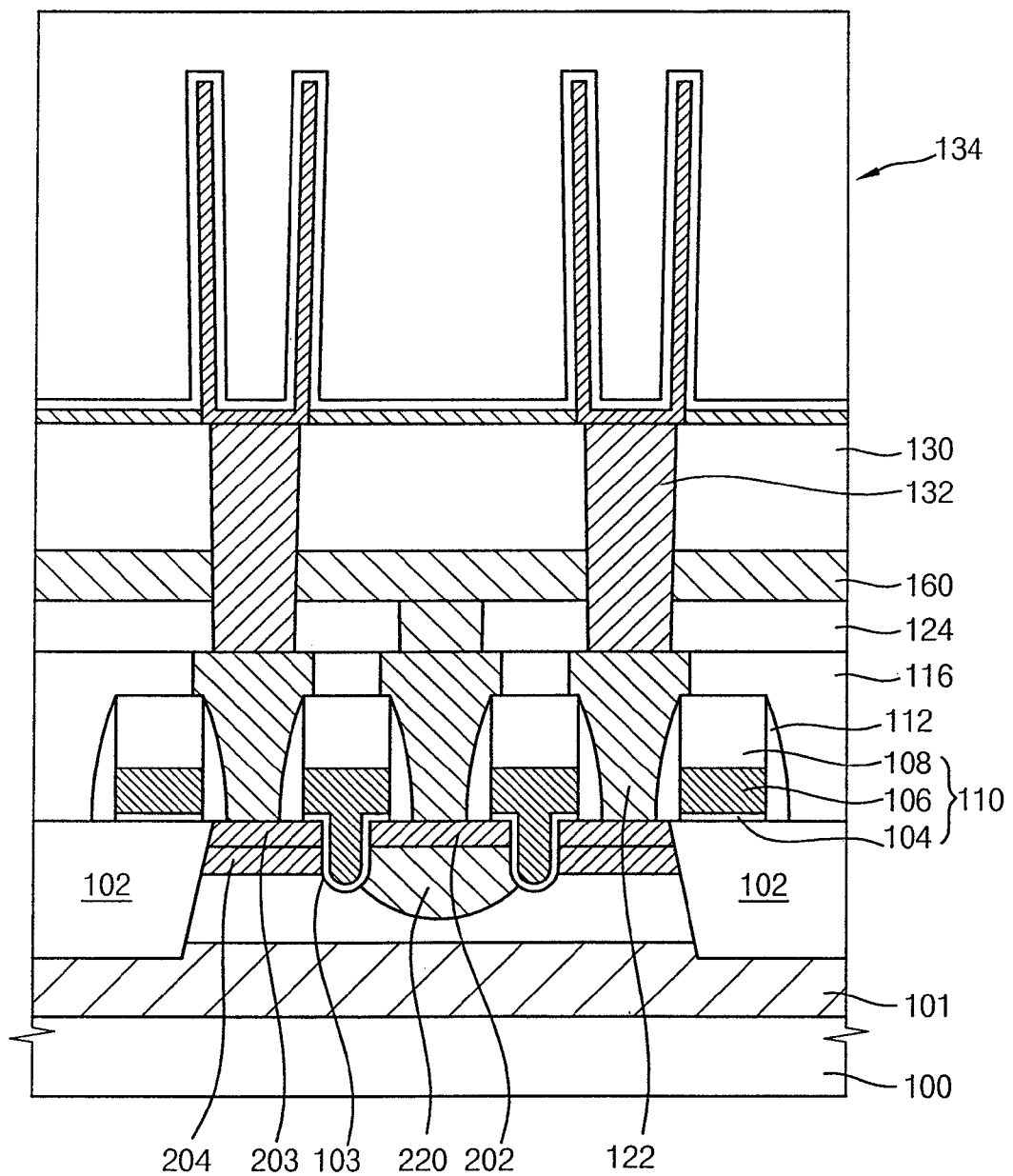

Thereafter, the above processing steps described with reference to FIG. 11 are performed to complete the DRAM device shown in FIG. 22.

According to embodiments of the present invention, a channel doping region of a transistor contacts one of the impurity regions. Thus, a junction leakage current is reduced at the impurity regions that do not contact the channel-doping region. In addition, the semiconductor pattern on the substrate between the gate structures increases a contact area of a contact pad to minimize an electrical resistance of the contact pad and improve an operation characteristic of a DRAM device.

Although exemplary embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention.

What is claimed is:

1. A method of manufacturing a semiconductor device, comprising:

forming a plurality of gate trenches on a substrate by partially etching the substrate;

forming a plurality of gate structures on the substrate, wherein a lower portion of at least some of the plurality of gate structures is formed in the plurality of gate trenches;

forming a gate spacer on a portion of a sidewall of each gate structure protruded from the substrate;

forming a semiconductor pattern on the substrate between the plurality of gate structures;

forming a channel doping region in the substrate between predetermined adjacent gate spacers by implanting a second conductive type impurity onto the semiconductor pattern; and forming a first impurity region and a second impurity region in the semiconductor pattern and at surface portions of the substrate by implanting a first conductive type impurity onto the semiconductor pattern, wherein the first impurity region is surrounded by the channel doping region.

2. The method of claim 1, wherein the semiconductor pattern is formed through a selective epitaxial growth (SEG) process.

3. The method of claim 1, wherein the second conductive type impurity is implanted deeper than the first conductive type impurity for forming the channel doping region under the first impurity region.

4. The method of claim 1, further comprising:

forming a first insulation interlayer to cover the plurality of gate structures;

forming first and second contact pads through the first insulation interlayer, wherein the first contact pad contacts the first impurity region and the second contact pad contacts the second impurity region;

forming a second insulation interlayer on the first insulation interlayer and the first and second contact pads;

forming a bit line on the second insulation interlayer, wherein the bit line includes a bit line contact formed through the second insulation interlayer for contacting the first contact pad;

forming a third insulation interlayer on the second insulation interlayer to cover the bit line;

forming a storage node contact through the third insulation interlayer, wherein the storage node contact contacts the second contact pad; and forming a capacitor on the storage node contact.

* * * * *